(12) United States Patent
O'Brien et al.

(10) Patent No.: US 8,759,862 B2
(45) Date of Patent: Jun. 24, 2014

(54) OPTOELECTRONIC COMPONENT (75) Inventors: David O'Brien, Bad Abbach (DE);
Martin Haushalter, Regensburg (DE);
Markus Foerste, Neubiberg (DE);
Frank Möllmer, Matting bei Pentling (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/703,075

(22) PCT Filed: May 24, 2011

(86) PCT No.: PCT/EP2011/058489
§ 371 (c)(1),
(2), (4) Date: Jan. 28, 2013

(87) PCT Pub. No.: WO2011/157515
PCT Pub. Date: Dec. 22, 2011

(65) Prior Publication Data
US 2013/0200411 A1 Aug. 8, 2013

(30) Foreign Application Priority Data
Jun. 16, 2010 (DE) .......................... 10 2010 023 955

(51) Int. Cl.
*H01L 33/00* (2010.01)
(52) U.S. Cl.
USPC ......... 257/98; 257/99; 257/100; 257/E23.031
(58) Field of Classification Search
CPC ................. H01L 33/58; H01L 33/60
USPC ............................. 257/88, 98–100, 433–434
See application file for complete search history.

(56) References Cited

U.S. PATENT DOCUMENTS

| | | | | |
|---|---|---|---|---|
| 5,226,723 | A * | 7/1993 | Chen | 362/241 |
| 7,687,815 | B2 * | 3/2010 | Kim | 257/98 |
| 8,227,821 | B2 | 7/2012 | Bogner et al. | |
| 8,502,251 | B2 * | 8/2013 | Oberleitner et al. | 257/98 |
| 2004/0036078 | A1 | 2/2004 | Kondo | |
| 2004/0124487 | A1 * | 7/2004 | Loh | 257/433 |
| 2006/0102917 | A1 | 5/2006 | Oyama et al. | |
| 2006/0255357 | A1 | 11/2006 | Hata et al. | |
| 2006/0285804 | A1 | 12/2006 | Kinoshita | |
| 2007/0069230 | A1 * | 3/2007 | Yu | 257/98 |

(Continued)

FOREIGN PATENT DOCUMENTS

DE 101 17 890 A1 10/2002
DE 10 2004 045 950 A1 3/2006

(Continued)

OTHER PUBLICATIONS

Japanese Examination Report issued on Jan. 6, 2014 for Japanese Application No. 2013-514617.

*Primary Examiner* — Dung A. Le
(74) *Attorney, Agent, or Firm* — DLA Piper LLP (US)

(57) ABSTRACT

An optoelectronic component includes a circuit board having a top side with a chip connection region, an optoelectronic semiconductor chip fixed to the chip connection region, a housing body fixed to the circuit board at the top side of the circuit board and having a reflector region, wherein the reflector region includes an opening in the housing body, the optoelectronic semiconductor chip being arranged in the opening, and the housing body is formed with a plastics material which is metallized at least in selected locations in the reflector region.

16 Claims, 5 Drawing Sheets

(56) References Cited

U.S. PATENT DOCUMENTS

| | | |
|---|---|---|
| 2008/0185605 A1 | 8/2008 | Wada et al. |
| 2008/0265266 A1 | 10/2008 | Bogner et al. |
| 2009/0224271 A1 | 9/2009 | Seo et al. |
| 2010/0078669 A1 * | 4/2010 | Cho et al. .................. 257/98 |
| 2010/0127300 A1 | 5/2010 | Lee et al. |
| 2010/0140648 A1 | 6/2010 | Harada et al. |

FOREIGN PATENT DOCUMENTS

| | | |
|---|---|---|
| JP | 6-350206 | 12/1994 |
| JP | 8-32118 | 2/1996 |
| JP | 2002-305328 | 10/2002 |
| JP | 2006-156462 | 6/2006 |
| JP | 2007-103402 | 4/2007 |
| JP | 2009218274 | 9/2009 |
| WO | 2004/077558 A1 | 9/2004 |
| WO | 2007/015426 A1 | 2/2007 |
| WO | 2009/066206 A1 | 5/2009 |
| WO | 2009/075530 A2 | 6/2009 |
| WO | 2010/035206 A1 | 4/2010 |

\* cited by examiner

OPTOELECTRONIC COMPONENT

RELATED APPLICATIONS

This is a §371 of International Application No. PCT/EP2011/058489, with an international filing date of May 24, 2011 (WO 2011/157515 A1, published Dec. 22, 2011), which is based on German Patent Application No. 10 2010 023 955.0, filed Jun. 16, 2010, the subject matter of which is incorporated herein by reference.

TECHNICAL FIELD

This disclosure relates to an optoelectronic component.

BACKGROUND

WO 2004/077558 A1 describes an optoelectronic component. However, it could be helpful to provide an optoelectronic component which is particularly compact.

SUMMARY

We provide an optoelectronic component including a circuit board having a top side with a chip connection region, an optoelectronic semiconductor chip fixed to the chip connection region, a housing body fixed to the circuit board at the top side of the circuit board and having a reflector region, wherein the reflector region includes an opening in the housing body, the optoelectronic semiconductor chip being arranged in the opening, and the housing body is formed with a plastics material which is metalized at least in selected locations in the reflector region.

DETAILED DESCRIPTION

The optoelectronic component may comprise a circuit board. The circuit board may comprise, for example, a base body formed with an electrically insulating material. Conductor tracks and electrical connection locations serving for making electrical contact with components of the optoelectronic component applied to the circuit board are structured onto and/or into the base body.

The circuit board comprises, for example, a base body formed with a plastics material. In this case, the base body can consist of the plastics material. By way of example, the circuit board is a printed circuit board (PCB).

The circuit board comprises a top side formed, for example, by a first main area of the circuit board. Furthermore, the circuit board comprises an underside facing away from the top side. At its top side, the circuit board has a chip connection region. The chip connection region is, for example, a metalized region of the circuit board to which, for example, an optoelectronic semiconductor chip can be fixed and electrically conductively connected. In this case, the circuit board can also have two or more chip connection regions formed in identical design at its top side.

The optoelectronic component may comprise an optoelectronic semiconductor chip fixed to the chip connection region. The optoelectronic semiconductor chip can, for example, be soldered to the chip connection region or adhesively bonded thereon. The optoelectronic semiconductor chip is a radiation-receiving or a radiation-emitting optoelectronic semiconductor chip. By way of example, the optoelectronic semiconductor chip is a light emitting diode chip suitable, during operation, to generate electromagnetic radiation from the infrared range, the spectral range for visible light and/or the spectral range of UV radiation. The component can also comprise two or more optoelectronic semiconductor chips, wherein each optoelectronic semiconductor chip is fixed to a chip connection region.

Preferably, the optoelectronic semiconductor chip is a surface emitter. That is to say that the optoelectronic semiconductor chip emits the emitted electromagnetic radiation for the most part or completely through a main area, for example, at the top side of the optoelectronic semiconductor chip. Hardly any or no electromagnetic radiation at all is then emitted through the side areas of the optoelectronic semiconductor chip. For this purpose, the optoelectronic semiconductor chip is preferably a thin-film light emitting diode chip.

A thin-film light emitting diode chip is preferably distinguished by at least one of the following characteristic features:

a reflective layer is applied or formed at a main area (facing toward a carrier element, in particular the carrier substrate) of the radiation-generating semiconductor layer sequence, which is a radiation-generating epitaxial layer sequence, in particular, the reflective layer reflecting at least part of the electromagnetic radiation generated in the semiconductor layer sequence back into the latter;

the thin-film light emitting diode chip has a carrier element, which is not the growth substrate on which the semiconductor layer sequence was epitaxially grown, but rather a separate carrier element subsequently fixed to the semiconductor layer sequence;

the semiconductor layer sequence has a thickness of 20 μm or less, in particular 10 μm or less;

the semiconductor layer sequence is free of a growth substrate. In this case "free of a growth substrate" means that a growth substrate possibly used for growth has been removed from the semiconductor layer sequence or at least greatly thinned. In particular, it has been thinned such that on its own it is not self-supporting per se or together with the epitaxial layer sequence. The remaining residue of the greatly thinned growth substrate is, in particular, unsuitable as such for the function of a growth substrate;

the semiconductor layer sequence contains at least one semiconductor layer having at least one area having an intermixing structure which ideally leads to an approximately ergodic distribution of the light in the semiconductor layer sequence, that is to say that it has an as far as possible ergodically stochastic scattering behavior.

A thin-film light emitting diode chip is to a good approximation a Lambertian surface emitter and is therefore well suited, for example, for application in a headlight, for instance a motor vehicle headlight.

The component may comprise a housing body fixed to the circuit board at the top side of the circuit board. By way of example, the housing body can be fixed to the circuit board at the top side thereof by an adhesive. Furthermore, it is possible for the housing body to be fixed to the circuit board in a manner free of a connector. For this purpose, the housing body can be integrally molded onto the top side of the circuit board by an injection molding method or a transfer molding method, for example. A mechanical connection between housing body and circuit board can be effected, for example, during the curing of the material of the housing body.

The housing body has a reflector region. The reflector region is provided to reflect electromagnetic radiation generated by the optoelectronic semiconductor chip during operation or electromagnetic radiation to be detected by the optoelectronic semiconductor chip during operation.

The reflector region may comprise an opening in the housing body, the optoelectronic semiconductor chip being arranged in the opening. In this case, the opening preferably extends from the top side of the housing body facing away from the circuit board to the underside of the housing body facing the circuit board. That means that the circuit board with the chip connection region is exposed inside the opening. In this way, the housing body surrounds the optoelectronic semiconductor chip at least in places in the region of the opening. The side areas of the housing body in the opening facing the optoelectronic semiconductor chip form radiation-reflecting areas of the reflector region (that is to say the reflector area) and can be coated suitably for this purpose, for example. If the component has two or more optoelectronic semiconductor chips, then two or more optoelectronic semiconductor chips can be arranged in an opening. Furthermore, it is then also possible for the reflector region to comprise two or more openings and for exactly one optoelectronic semiconductor chip to be arranged in each opening.

The optoelectronic semiconductor chip may be embedded into a potting material, which appears white, black or colored, wherein that surface of the optoelectronic semiconductor chip facing away from the chip connection region is free of the potting material at least in places. In particular, the potting material can have the color of the outer area of the housing body.

The potting material can be radiation-opaque. The potting material is reflective, for example. For this purpose, the potting material can comprise, for example, a matrix material composed of silicone and/or epoxide filled with reflective particles, for example, composed of titanium oxide.

Furthermore, it is possible for the particles to consist of $ZrO_2$ or at least to contain $ZrO_2$. If the semiconductor chip emits blue or ultraviolet light, $ZrO_2$ has particularly low absorption properties in such a wavelength range. In other words, a high proportion of electromagnetic radiation is reflected by the potting material in this case.

Overall, it is possible for the radiation-reflecting particles to consist at least of one of the materials $TiO_2$, $BaSO_4$, $ZnO$, $Al_xO_y$, $ZrO_2$ or to contain one of the materials mentioned. The potting material then appears as white, for example.

Furthermore, it is possible for the potting material to be filled with radiation-absorbing particles, for example, composed of carbon black such that the potting material appears black.

The optoelectronic semiconductor chip is preferably a surface emitter, for example, a thin-film light emitting diode chip. That is to say that the optoelectronic semiconductor chip is then, in particular, not a volume emitter. That is to say that hardly any electromagnetic radiation emerges through the side areas of the semiconductor chip in this case.

The housing body may be formed with a plastics material. The plastics material is preferably a plastics material which is particularly thermally stable and which is preferably melt-processable. By way of example, for this purpose the housing body is formed with a polyphenyl sulfide (PPS). The base body of the circuit board can then be formed with the same plastics material or with a plastics material having a similar coefficient of thermal expansion.

The housing body may be metalized in the reflector region at least in places. That is to say that parts of the housing body, for example, in the opening in the housing body, are covered by a metal layer at least in places. By way of example, a reflector area of the reflector region can be formed by the metalized regions of the housing body. The housing body is then metalized, for example, only in the opening of the reflector region. Other parts of the housing body are free of the metalization. However, it is also possible for all exposed outer areas of the housing body to be metalized. Such an optoelectronic component can be produced particularly simply.

Metalization of the housing body can be applied to the plastics material of the housing body by thermal evaporation, for example. The metal applied to the housing body in this case is selected with regard to the electromagnetic radiation to be detected or emitted by the optoelectronic semiconductor chip during operation. By way of example, gold is suitable for infrared radiation having wavelengths of 800 nm or more. A metalization comprising silver or aluminum is suitable, in particular for the visible range. The metal of the metalization is preferably applied directly to the housing body. When using metals which tend toward corrosion and diffusion, a passivation layer is applied to the metalization at its side facing away from the housing body, the passivation layer being radiation-transmissive and preferably transparent to the radiation to be reflected. The passivation layer can be formed, for example, with a silicon oxide and/or a silicon nitride.

The component may comprise a circuit board which has a top side having a chip connection region, an optoelectronic semiconductor chip fixed to the chip connection region, a housing body fixed to the circuit board at the top side of the circuit board and has a reflector region, wherein the reflector region comprises an opening in the housing body, the optoelectronic semiconductor chip being arranged in the opening, and the housing body is formed with a plastics material metalized at least in places in the reflector region.

In this case, the optoelectronic component described here is based on the following concepts, inter alia:

The use of a thin circuit board, for example, of a printed circuit board, leaves space for a relatively thick housing base body without a predefinable total thickness of the optoelectronic component being exceeded. The reflector region, which comprises, for example, an opening in the housing base body which completely penetrates through the latter, can thus be formed particularly high above the optoelectronic semiconductor chip without the structural height of the component overall increasing to an excessively great extent. As a result, particularly narrow emission angles of at most 20° half emission cone are made possible in conjunction with a compact design.

The reflector region may also reduce the problem of so-called "crosstalk" of adjacent radiation-emitting opto-electronic components of identical design since the radiation of optoelectronic components arranged adjacent to one another is guided such that it cannot impinge on the semiconductor chips of the adjacently arranged optoelectronic components and, consequently, cannot be absorbed or scattered by the components either.

The use of a housing body formed with a plastics material and can be produced by a transfer or injection molding method allows particularly simple production of the reflector region in a manner exhibiting register accuracy. In this case, the reflector region, in particular the opening of the reflector region, can be made particularly small such that the area of a reflector opening facing the optoelectronic semiconductor chip is of the order of magnitude of the area content of the outer area of the optoelectronic semiconductor chip.

The circuit board may have at its top side a wire connection region spaced apart from the chip connection region. That is to say that wire connection region and chip connection region are both arranged at the top side of the circuit board, for example, are electrically insulated from one another by the base body of the circuit board and arranged at a distance from another at the top side of the circuit board. The housing body furthermore has a wire region comprising an opening in the housing body. In this case, the wire region is spaced apart from the reflector region. That is to say, for example, that reflector region and wire region do not comprise the same opening in the housing body. Instead, at least two openings are formed in the housing body and completely penetrate through the housing body, wherein the first opening is assigned to the reflector region and the second opening is assigned to the wire region. The wire connection region of the circuit board is then arranged in the second opening, that is to say in the wire region. The opening therefore forms a perforation in the housing body at which at least the wire connection region at the top side of the circuit board is exposed.

The optoelectronic component may comprise a connection wire fixed to the optoelectronic semiconductor chip and to the wire connection region. With the connection wire, electrical contact is made with the optoelectronic semiconductor chip on the n-side, for example. In this case, the connection wire is led through a cutout in the housing body, the cutout connecting the reflector region and the wire region to one another. By way of example, the cutout is a tunnel or trench in the housing material extending from the reflector region to the wire region. At a bottom area of the cutout, the circuit board can in this case be exposed in places. In this case, the cutout is, for example, a perforation in the housing body. However, it is also possible for the housing body not to be completely removed in the region of the cutout such that the bottom area of the cutout is formed by material of the housing body. In any case, the connection wire is led through the cutout between reflector region and wire region such that the connection wire does not project beyond a top side of the housing body facing away from the circuit board.

The housing body may completely cover the circuit board apart from the reflector region and, if present, the wire region and the cutout, at the top side of the circuit board. That is to say that the top side of the circuit board is covered by the housing body and not accessible and/or not visible externally apart from the regions mentioned.

At least one side area of the housing body may terminate at least in places flush with at least one side area of the circuit board. By way of example, it is possible for all side areas of housing body and circuit board to terminate flush with one another.

The base area of the housing body may have the same form as the base area of the circuit board, and/or the base area of the housing body may have the same size as the base area of the circuit board. If the circuit board is rectangular or square, for example, then the housing body is a parallelepiped. The side areas of circuit board and housing body can then terminate flush with one another. Overall, the optoelectronic component then has the form of a parallelepiped in which the underside is formed by the circuit board. The at least one opening in the reflector region is situated at the top side of the parallelepiped facing away from the underside.

The reflector region may comprise a reflector opening in proximity to the chip and a reflector opening remote from the chip. In this case, by way of example, the opening assigned to the reflector region tapers from the reflector opening remote from the chip to the reflector opening in proximity to the chip. That is to say, in particular, that the reflector opening remote from the chip has a larger area content than the reflector opening in proximity to the chip. At least one reflector area of the reflector region connects the reflector opening in proximity to the chip and the reflector opening remote from the chip to one another. The reflector area is formed, for example, by the metalized housing body of the optoelectronic component within the opening. That is to say that the reflector area is formed by a part of the housing body which is metalized at least in places. In this case, it is possible, in particular, for the housing body to be metalized only in the region of the reflector area such that particularly little metal is required for forming the metalization.

The reflector opening in proximity to the chip may have an area content which is at most four times the magnitude of the area content of the main area of the optoelectronic semiconductor chip which faces away from the circuit board. By way of example, the main area of the semiconductor chip is the top area thereof. A radiation emission in the case of a radiation-emitting optoelectronic semiconductor chip can then be effected, for example, for the most part through the main area. Such a particularly small reflector opening in proximity to the chip can be achieved by virtue of the fact that the wire connection region of the optoelectronic component is arranged in a manner spaced apart from the chip connection region and the wire region of the housing body can thus be arranged in a manner spaced apart from the reflector opening. In this way, the reflector opening can be chosen to be particularly small and has to be dimensioned only with regard to its optical properties.

The circuit board may have an underside facing away from the top side, wherein component connection regions are formed at the underside of the circuit board. The optoelectronic component is surface-mountable by the component connection regions.

The optoelectronic component may have a thickness of at most 1 mm, wherein the circuit board has a thickness of at most 0.35 mm and the housing body has a thickness of at most 0.65 mm. Such a small thickness of the optoelectronic component is made possible, in particular, by the use of a circuit board having a base body composed of plastic and a housing body which can be produced by an injection or transfer molding method. The use of a circuit board having a base body composed of plastic makes possible a particularly thin circuit board. The production methods mentioned allow the housing body and in particular the reflector region to be produced in a manner exhibiting particularly accurate register.

The optoelectronic component described here is explained in greater detail below on the basis of examples and associated Drawings.

Elements that are identical, of identical type or act identically are provided with the same reference signs. The size relationships of the elements illustrated in the Drawings among one another should not be regarded as to scale. Rather, individual elements may be illustrated with an exaggerated size to enable better illustration and/or to afford a better understanding.

Figure 1A:
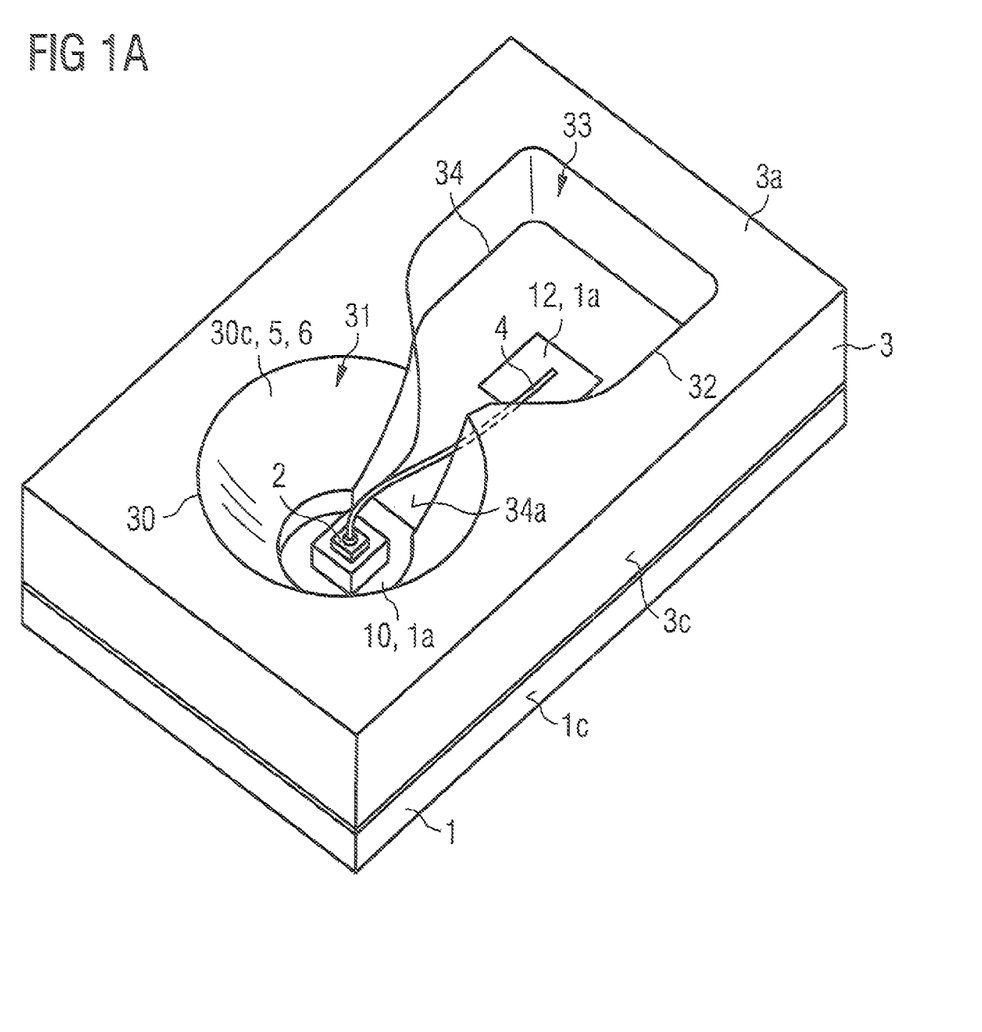
FIGS. 1A, 1B, 1C, 1D, 1E, 1F and 1G show different schematic views of an example of our optoelectronic component.

FIG. 1A shows a schematic perspective illustration of an example of an optoelectronic component. The optoelectronic component comprises a circuit board 1, which, in this case, for example, has a base body 11 (in this respect, cf. FIG. 1C, for example) consisting of a plastic. A housing body 3 is arranged at the top side 1*a* of the circuit board 1. The side areas 1c of the circuit board 1 and the side areas 3c of the housing body 3, respectively, terminate flush with one another.

Circuit board 1 and housing body 3 have a rectangular base area of identical form and size. Overall, the optoelectronic component has a parallelepipedal form, wherein the underside of the parallelepiped is formed by the circuit board 1.

Two openings 31, 33 and a cutout 34 toward the circuit board 1 are formed at the top side 3a of the housing body 3.

The reflector region 30 comprises the first opening 31. The first opening 31 extends from the top side 3a of the housing body 3 to the top side 1a of the circuit board 1 such that the top side 1a of the circuit board 1 is exposed in places in the region of the opening 31. The circuit board 1 comprises the chip connection region 10 there. An optoelectronic semiconductor chip 2, for example, a light emitting diode chip, is fixed and electrically connected to the chip connection region 10.

The reflector area 30c extends around the optoelectronic semiconductor chip 2. The reflector area is formed, for example, by the housing body 3 in the region of the opening 31, the housing body being coated there at least with a metal layer 5 (in this respect, cf. for example, the sectional illustration in FIG. 1C). If necessary, that side of the metal layer 5 facing away from the housing body 3 can be coated with a passivation layer 6 radiation-transmissive, preferably transparent.

Figure 1B:
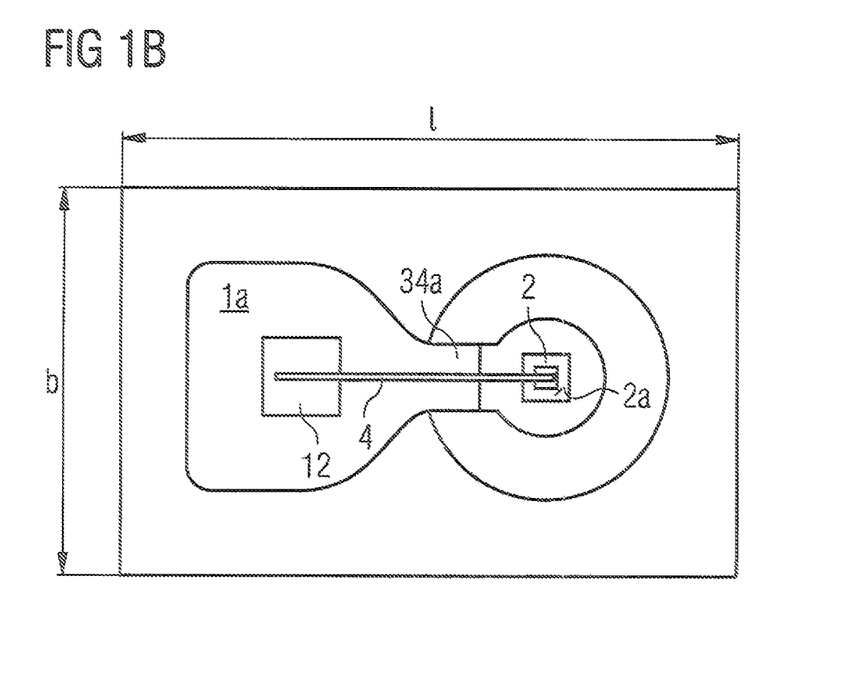
Figure 1C:
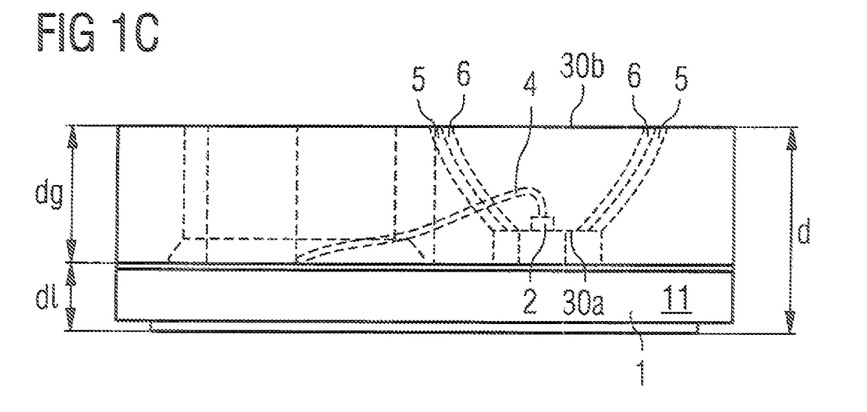
Figure 1D:
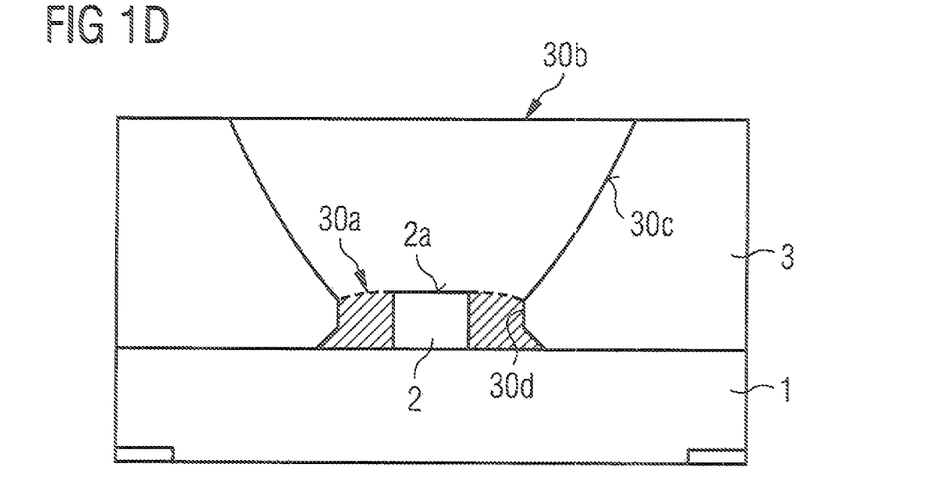
Figure 1E:
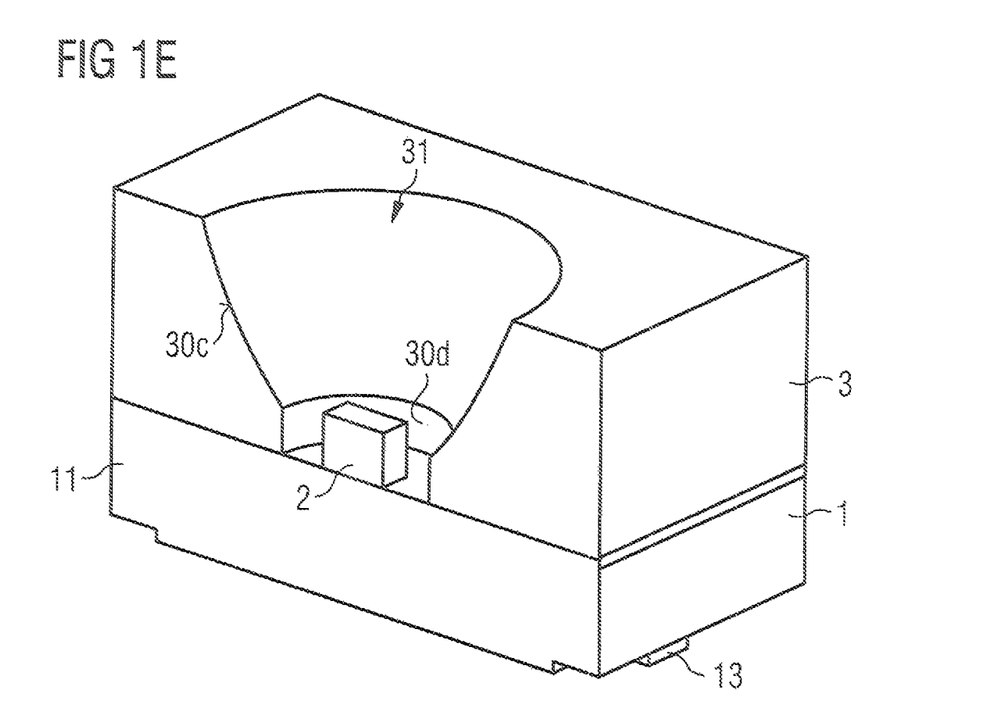

A ring 30d can be adjacent to the reflector area 30c, which runs obliquely with respect to the top side 1a of the circuit board 1, which ring runs perpendicularly or substantially perpendicularly to the circuit board 1 at its top side 1a (in this respect, cf. the schematic, perspective sectional illustration in FIG. 1E). In the region of the ring, the base body 3 can be free of the metal layer 5. By way of example, it is possible that, for setting the emission characteristic, the base body 3 in this region is radiation-absorbent for electromagnetic radiation generated by the optoelectronic semiconductor chip during operation. However, it is also possible that, in the region of the ring, too, the metal layer 5 is applied to the base body 3. The ring 30d has a height maximally corresponding to the height of the optoelectronic semiconductor chip.

The housing body 3 has a second opening 33, the wire region 32 comprising the second opening. The top side 1a of the circuit board 1 with the wire connection region 12 is exposed in the opening 33.

A connection wire 4 for making electrical contact with the optoelectronic semiconductor chip 2 is led from the optoelectronic semiconductor chip 2 to the wire connection region 12 and fixed to the optoelectronic semiconductor chip 2 and the wire connection region 12.

In this case, the connection wire 4 is led through the cutout 34 in which the reflector area 30c is perforated in places. The top side 1a of the circuit board 1 can be exposed at the bottom area 34a (cf. the schematic plan view in FIG. 1B) of the cutout 34. In this case, it is possible for the circuit board 1 to be radiation-absorbent, for example, black at its top side 1a in the wire region 32 and in the region of the bottom area 34a of the cutout 34 to avoid disturbing reflections in the regions. By contrast, the circuit board 1 can be reflectively coated at its top side 1a in the reflector region 30. By way of example, a silicone potting filled with titanium oxide can be introduced there, which potting can also cover the ring 30d.

The opening 31, the reflector region 30 comprising the opening, can be filled with a radiation-transmissive potting material which reaches as far as the top side 3a of the base body 3 or projects beyond the latter. The opening 33, the wire region 32 comprising the opening, and the cutout 34 can be covered with a potting material having, for example, the same color as the base body 3 at its top side 3a such that the wire region 32 cannot be discerned externally. Furthermore, it is possible for the potting material to be black and thus suitable for absorbing stray light, for example.

FIG. 1B shows a schematic plan view of the example of the optoelectronic component. The width b of the optoelectronic component is preferably at most 2 mm, for example, 1.7 mm. The length of the optoelectronic component 1 is preferably at most 3 mm, for example, 2.75 mm.

FIG. 1C shows a schematic sectional illustration of the example of the optoelectronic component. The total thickness of the optoelectronic component d is preferably at most 1 mm, for example, 0.9 mm. The thickness of the circuit board 1 dl is preferably at most 40 mm, for example, 0.3 mm, and the thickness of the base body 3 dg is preferably at most 0.65 mm, for example, 0.6 mm. Overall, a particularly compact optoelectronic component is realized wherein, on account of the small thickness of the circuit board 1, it is possible to form the reflector in the reflector region 30 relatively high, namely at least 0.6 mm high.

Figure 2:
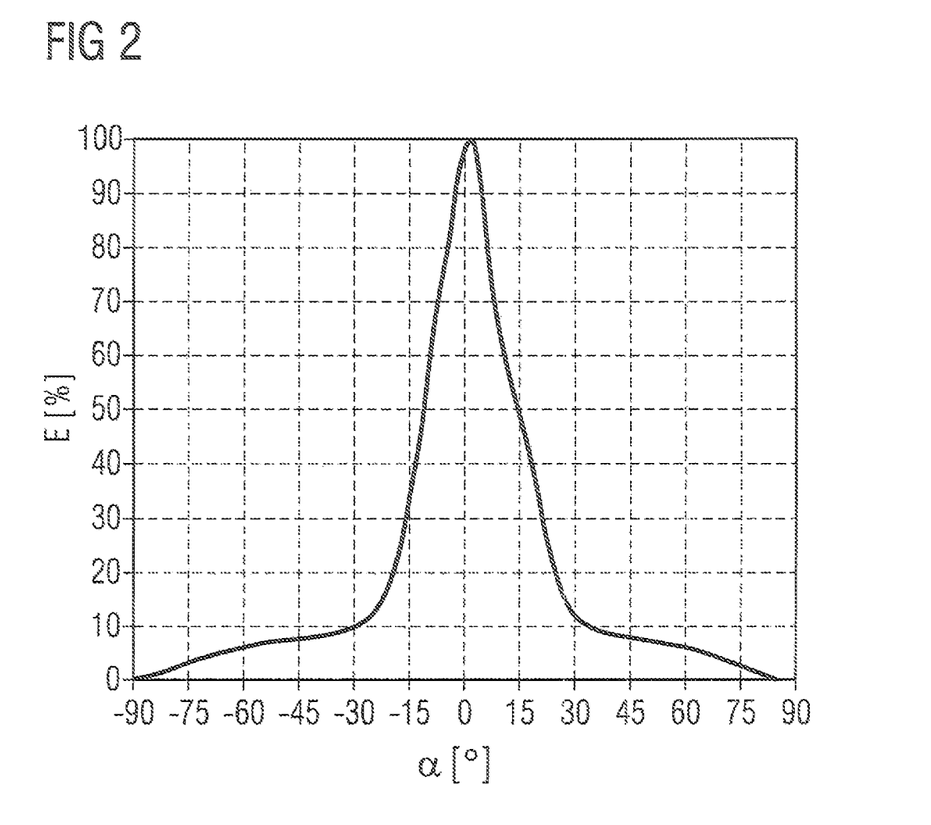
FIG. 2 shows a graphical plot of the relative intensity E of the electromagnetic radiation emitted by the component during operation as a function of the emission half-angle α.

The schematic sectional illustration in FIG. 1D shows that the area content of the main area 2a of the optoelectronic semiconductor chip 2 is of the order of magnitude of the reflector opening 30a in proximity to the chip. In conjunction with the relatively large height of the reflector, it is possible to achieve an emission half-angle $\alpha$ of at most 20°, for example, 13° (in this respect, cf. the graphical plot in FIG. 2). The emission intensity when using a radiation-emitting optoelectronic semiconductor chip can then be, for example, 80 mW per steradian (sr) given energization with 70 mA.

Figure 1F:
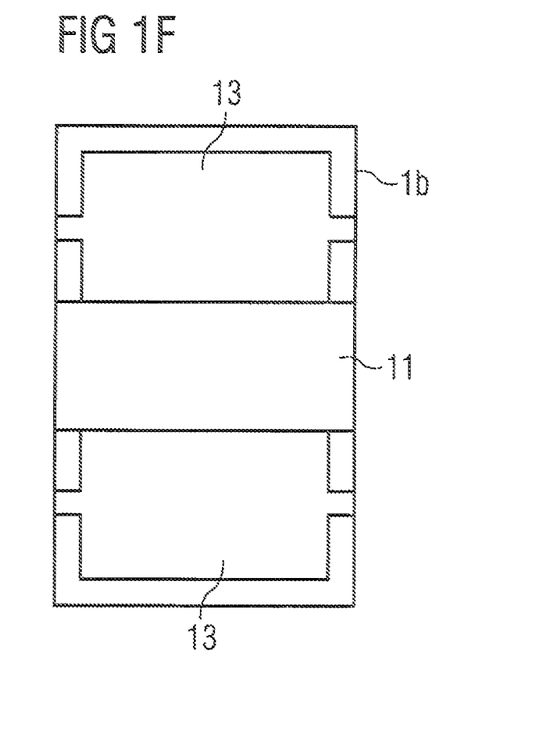

In conjunction with the plan view of the underside 1b of the circuit board 1 in FIG. 1F, it can be discerned that component connection regions 13 are arranged at the underside 1b of the circuit board 1, which component connection regions are electrically conductively connected to the chip connection region 10 and the wire connection region 12, respectively, and serve for the surface mounting of the optoelectronic component.

Figure 1G:
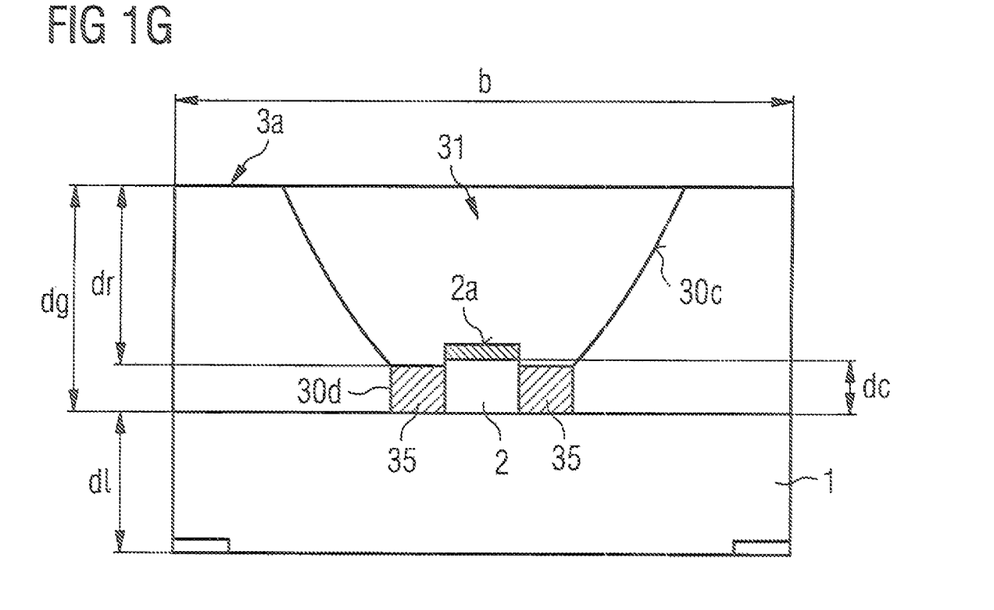

FIG. 1G shows a schematic sectional illustration of the example of the optoelectronic component. It can be seen in FIG. 1G that the optoelectronic semiconductor chip 2 has a height dc of at most 0.20 mm, for example, 0.15 mm. The height dr of the reflector area 30c is, for example, at least 0.4 mm, for example, 0.47 mm. The diameter of the first opening 31 at the top side 3a of the housing body 3 is, for example, at least 0.6 mm and at most 1.1 mm, for example, 1 mm.

FIG. 1G furthermore illustrates that the optoelectronic semiconductor chip 2 can be surrounded by a potting material 35 in the region of the ring 30d. In this case, the potting material 35 can extend as far as the top side of the semiconductor chip 2 and terminate flush with the semiconductor chip 2 at the top side thereof.

The potting material 35 can be radiation-opaque. For example, the potting material is embodied as reflective. For this purpose, the potting material 35 can comprise, for example, a matrix material composed of silicone and/or epoxide filled with reflective particles, for example, composed of titanium oxide. The potting material then appears as white.

Furthermore, it is possible for the particles to consist of $ZrO_2$ or at least to contain $ZrO_2$. If the semiconductor chip 2 emits blue or ultraviolet light, $ZrO_2$ has particularly low absorption properties in such a wavelength range. In other words, a high fraction of electromagnetic radiation is reflected by the potting material in this case.

Overall, it is possible for the radiation-reflecting particles to consist at least of one of the materials $TiO_2$, $BaSO_4$, ZnO, $Al_xO_y$, $ZrO_2$ or to contain one of the materials mentioned.

Furthermore, it is possible for the potting material 35 to be filled with radiation-absorbing particles, for example, composed of carbon black, such that the potting material 35 appears black. The optoelectronic semiconductor chip 2 is preferably a surface emitter embodied, for example, as a thin-film light emitting diode chip. That is to say that the optoelectronic semiconductor chip 2 is then, in particular, not a volume emitter.

Our optoelectronic components are not restricted to the examples by the description on the basis of those examples. Rather, this disclosure encompasses any novel feature and any combination of features which in particular includes any combination of features in the appended claims, even if the feature or combination itself is not explicitly specified in the claims or examples.

The invention claimed is:

1. An optoelectronic component comprising:
    a circuit board having a top side with a chip connection region,
    an optoelectronic semiconductor chip fixed to the chip connection region,
    a housing body fixed to the circuit board at the top side of the circuit board and having a reflector region, wherein
    the reflector region comprises an opening in the housing body, the optoelectronic semiconductor chip being arranged in said opening,
    the housing body is formed with a plastics material which is metalized at least in selected locations in the reflector region,
    wherein the circuit board has at its top side a wire connection region spaced apart from the chip connection region,
    the housing body has a wire region comprising an opening in the housing body, the wire connection region being arranged in said opening, and
    the wire region is spaced apart from the reflector region, and further comprising:
    a connection wire fixed to the optoelectronic semiconductor chip and the wire connection region, wherein
    the connection wire is led through a cutout in the housing body, which cutout connects the reflector region and the wire region to one another.

2. The optoelectronic component according to claim 1, wherein the optoelectronic semiconductor chip is embedded into a potting material which is white, black or colored, wherein a surface of the optoelectronic semiconductor chip facing away from the chip connection region is free of the potting material.

3. The optoelectronic component according to claim 1, wherein the circuit board has a base body formed with a plastic.

4. The optoelectronic component according to claim 1, wherein, at a bottom area of the cutout, the circuit board is exposed in selected locations.

5. The optoelectronic component according to claim 1, wherein the housing body completely covers the circuit board apart from the reflector region of the circuit board.

6. The optoelectronic component according to claim 1, wherein the housing body at side areas terminates at least in places flush with side areas of the circuit board.

7. The optoelectronic component according to claim 1, wherein a base area of the housing body has the same form as a base area of the circuit board.

8. The optoelectronic component according to claim 1, wherein a base area of the housing body has the same size as a base area of the circuit board.

9. The optoelectronic component according to claim 1, wherein
    the reflector region comprises a reflector opening in proximity to the chip and a reflector opening remote from the chip,
    the opening of the reflector region tapers from the reflector opening remote from the chip to the reflector opening in proximity to the chip,
    at least one reflector area of the reflector region connects the reflector opening in proximity to the chip and the reflector opening remote from the chip to one another, and
    the reflector area is formed by a part of the housing body which is metalized at least in selected locations.

10. The optoelectronic component according to claim 9, wherein the housing body is metalized only in the region of the reflector area.

11. The optoelectronic component according to claim 9, wherein the reflector opening in proximity to the chip has an area content which is at most four times the magnitude of the area content of a main area of the optoelectronic semiconductor chip.

12. The optoelectronic component according to claim 1, wherein the circuit board has an underside facing away from the top side, wherein component connection regions for surface mounting are formed at the underside.

13. The optoelectronic component according to claim 1, having a thickness (d) of at most 1.0 mm, wherein the circuit board has a thickness (dl) of at most 0.35 mm and the housing body has a thickness (dg) of at most 0.65 mm.

14. The optoelectronic component according to claim 1, wherein the circuit board has a base body formed with polyphenylene sulfide.

15. The optoelectronic component according to claim 1, wherein the housing body completely covers the circuit board apart from the reflector region and apart from the wire region and apart from the cutout at the top side of the circuit board.

16. An optoelectronic component comprising:
    a circuit board having a top side with a chip connection region,
    an optoelectronic semiconductor chip fixed to the chip connection region,
    a housing body fixed to the circuit board at the top side of the circuit board and having a reflector region, wherein
    the reflector region comprises an opening in the housing body, the optoelectronic semiconductor chip being arranged in said opening,
    the housing body is formed with a plastics material which is metalized at least in selected locations in the reflector region,
    the optoelectronic semiconductor chip is embedded into a potting material which is white, black or colored, wherein
    a surface of the optoelectronic semiconductor chip facing away from the chip connection region is free of the potting material.

* * * * *